United States Patent [19]
Ota

[11] Patent Number: 6,061,119
[45] Date of Patent: May 9, 2000

[54] METHOD OF MEASURING IMAGE-FORMING ERROR OF PROJECTION OPTICAL SYSTEM, METHOD OF MANUFACTURING EXPOSURE APPARATUS, AND METHOD OF MANUFACTURING SEMICONDUCTOR DEVICE

[75] Inventor: Kazuya Ota, Tokyo, Japan

[73] Assignee: Nikon Corporation, Tokyo, Japan

[21] Appl. No.: 09/059,434

[22] Filed: Apr. 14, 1998

[30] Foreign Application Priority Data

Apr. 14, 1997 [JP] Japan ................................. 9-110081

[51] Int. Cl.$^7$ ........................... G03B 27/42; G03B 27/68
[52] U.S. Cl. ................................. 355/53; 355/52
[58] Field of Search ................. 355/53, 50, 52, 355/67, 77; 356/399, 400

[56] References Cited

U.S. PATENT DOCUMENTS

| | | | |
|---|---|---|---|
| 5,117,255 | 5/1992 | Shiraishi et al. ........................... | 355/53 |
| 5,402,224 | 3/1995 | Hirukawa et al. ...................... | 355/53.5 |
| 5,442,418 | 8/1995 | Murakami et al. ..................... | 355/55.5 |

FOREIGN PATENT DOCUMENTS 6-168320  6/1994  Japan .

*Primary Examiner*—Alan A. Mathews
*Assistant Examiner*—Hung Henry Nguyen
*Attorney, Agent, or Firm*—Foley & Lardner

[57] ABSTRACT

The present invention aims to provide a method of measuring an image-forming error of a projection lens without being influenced by atmospheric temperature at the time of coordinate measurement, and various kinds of applied techniques employing this measuring method. In particular, the measuring method according to the present invention enables errors to be measured with a high accuracy, while taking account of the temperature-dependent extraction or contraction component of the substrate, which is used for measuring the image-forming error.

22 Claims, 11 Drawing Sheets

METHOD OF MEASURING IMAGE-FORMING ERROR OF PROJECTION OPTICAL SYSTEM, METHOD OF MANUFACTURING EXPOSURE APPARATUS, AND METHOD OF MANUFACTURING SEMICONDUCTOR DEVICE

BACKGROUND OF THE INVENTION

1. Field of the Invention

The present invention relates to a method of measuring distortion of a projection optical system, a method of manufacturing a semiconductor device while correcting distortion, and so forth. In particular, it relates to a distortion measuring method in which a reference wafer is used for measuring deviation of each point from its designed value, a method of manufacturing a semiconductor device while correcting distortion, and so forth.

2. Related Background Art

Conventionally used for measuring distortion of a projection lens in a projection exposure apparatus is so-called reference wafer method in which a reference wafer is employed for measurement. In this method, deviations of individual points on the reference wafer from their respective designed values are determined, point by point, on the basis of coordinates of a coordinate measurement system.

SUMMARY OF THE INVENTION

As a result of studies concerning the above-mentioned conventional technique, the inventor has found the following problems. Namely, in the conventional technique such as that mentioned above, the reference wafer would expand or contract as temperature changes. Though there is no problem when the atmospheric temperature at the time of coordinate measurement coincides with that of the projection exposure apparatus, the magnification component of the lens cannot be measured accurately when a difference exists therebetween. Specifically, in the case where the temperature at the time of projection exposure is higher than that at the time of coordinate measurement, so that the reference wafer expands, the shot area would broaden correspondingly, thereby the shot magnification of the projection optical system would be measured greater than it actually is.

Therefore, it is an object of the present invention to provide a method of measuring distortion of a projection lens which can effect measurement without being influenced by the atmospheric temperature at the time of coordinate measurement, a method of manufacturing a semiconductor device which is performed while distortion is measured as such, and so forth.

The measuring method according to the present invention is a method of measuring, in an exposure apparatus exposing a pattern of a mask to a substrate by means of a projection optical system, an image-forming error in the projection optical system. In order to achieve the above-mentioned object, the measuring method according to the present invention comprises a first step of detecting a position of a first pattern disposed on the substrate in relation to expansion or contraction of the substrate, a second step of detecting the position of the first pattern in relation to expansion or contraction of the substrate while the substrate having the first pattern is mounted in the exposure apparatus, a third step of exposing a second pattern onto the first pattern by means of the projection optical system, and a fourth step of detecting the image-forming error of the projection optical system, on the basis of an amount of deviation between the first and second patterns and information relating to expansion or contraction of the substrate.

The measuring method according to the present invention can further comprise a step of detecting expansion or contraction of the substrate. The expansion or contraction of the substrate is detected by use of at least a change in interval of a plurality of shot areas set on the substrate or a change in interval of alignment marks provided on the substrate. Each shot area on the substrate is provided with the first pattern. The interval between the shot areas is defined, for example, by the distance between the center positions of the respective shot areas.

The measuring method according to the present invention can further comprise a step of detecting a position of the second pattern in a mask provided with the second pattern.

The measuring method according to the present invention can further comprise a step of adjusting the projection optical system so as to reduce the image-forming error thereof, on the basis of a result of detection of the fourth step.

The measuring method according to the present invention can further comprise a step of adjusting the projection optical system, on the basis of a result of detection of the first step before exposing the second pattern.

The method of manufacturing an exposure apparatus to which the measuring method according to the present invention is applied comprises the steps of: providing a mask stage for holding the mask; providing a substrate stage for holding the substrate; and providing, as the projection optical system, a projection optical system in which the image-forming error is measured by the measuring method according to the present invention and is adjusted. In this method of manufacturing an exposure apparatus, the image-forming error of the projection optical system includes distortion.

The method of manufacturing a semiconductor device to which the measuring method according to the present invention is applied comprises a first step of detecting a position of a first pattern provided on a substrate in relation to expansion or contraction of the substrate, a second step of detecting the position of the first pattern in relation to expansion or contraction of the substrate while the substrate having the first pattern is mounted in an exposure apparatus having a projection optical system, a third step of exposing a second pattern onto the first pattern by means of the projection optical system, and a fourth step of detecting an image-forming error of the projection optical system, on the basis of an amount of deviation between the first and second patterns and expansion or contraction of the substrate. This method of manufacturing a semiconductor device can further comprise the steps of: adjusting the projection optical system so as to reduce the image-forming error thereof; disposing a reticle provided with an actual pattern (circuit pattern or the like) and a product wafer at a predetermined position of the adjusted exposure apparatus so as to align the reticle and the product wafer with each other; and thereafter irradiating the reticle with a predetermined wavelength of exposure light so as to transfer the pattern of the reticle to the product wafer.

When a semiconductor device is thus manufactured while the measuring method according to the present invention is applied thereto, the distortion component can be accurately obtained without being influenced by the atmospheric temperature of each measurement environment, thereby it can easily be expected that throughput in manufacture of semiconductor devices would improve.

The manufacturing method and the like according to the present invention are applicable to projection exposure apparatus of both one-shot exposure type and scanning exposure type, without being restricted by exposure types in particular.

DETAILED DESCRIPTION OF THE PREFERRED EMBODIMENTS

Figure 8:
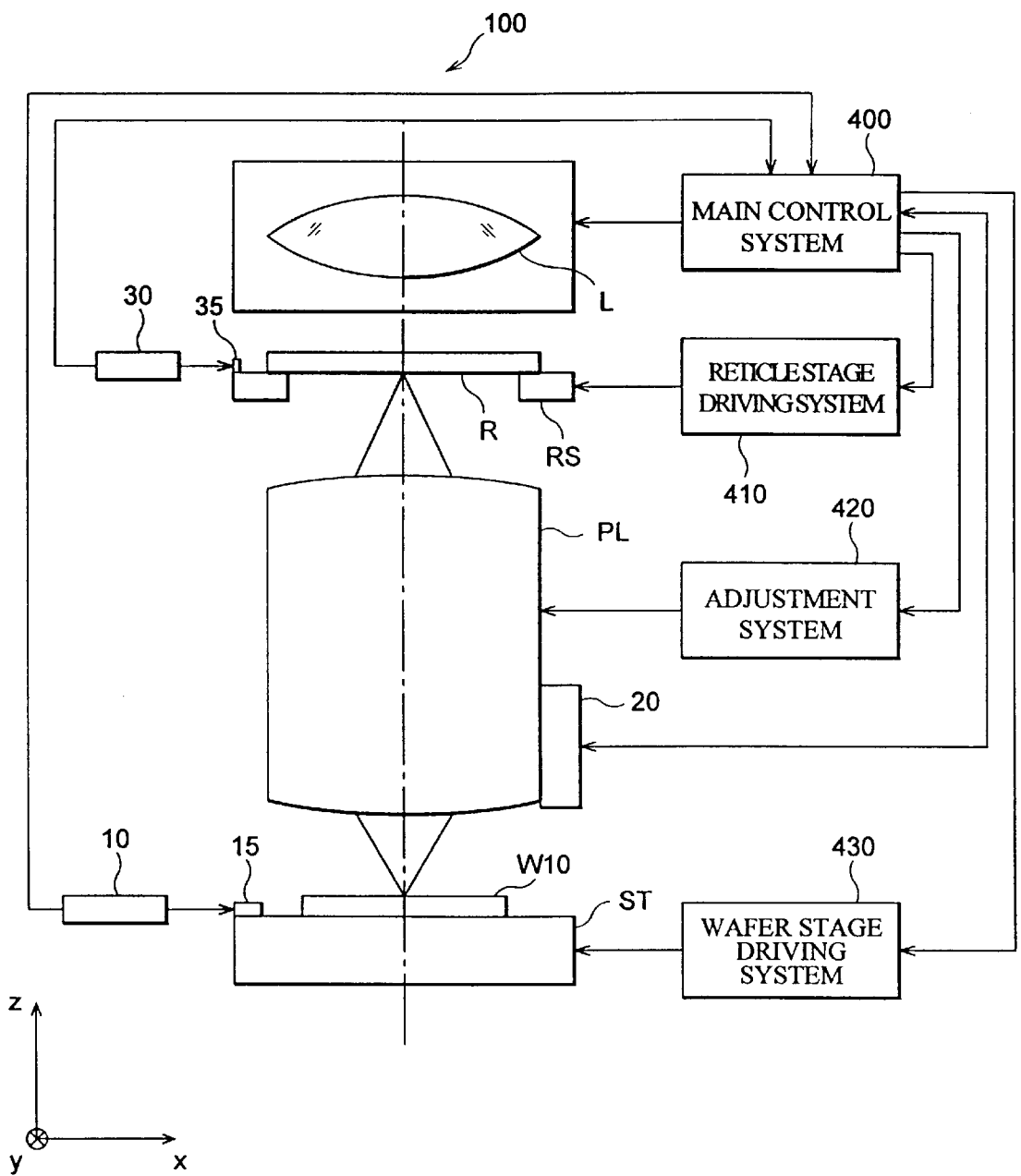
FIG. 8 is a schematic view of a projection exposure apparatus used in the present invention.

FIG. 8 shows a schematic configuration of the projection exposure apparatus used in the present invention. In this drawing, an illumination optical system L, a reticle R, and a projection lens system PL are successively disposed in this order, whereas a wafer W10 is mounted on a wafer stage ST so as to be placed at a position conjugate with the reticle R with respect to the projection lens system PL. A pattern (not depicted) on the reticle R uniformly illuminated by the illumination optical system L is projected and exposed onto the wafer by means of the projection lens system PL. A movable mirror 15 is firmly attached to the wafer stage ST, and a laser beam from a coordinate measurement system (length-measuring interferometer) 10 for the wafer stage ST irradiates the movable mirror 15. The coordinate measurement system (length-measuring interferometer) 10 receives the laser beam reflected by the movable mirror 15, so as to measure the position of the wafer stage ST.

In this exposure apparatus 100 to be measured, a reticle stage RS for holding the reticle R is movable in X and Y directions by a reticle stage driving system 410 according to an instruction from a main control system 400, and the position of the reticle stage RS is accurately measured by a laser interferometer 30. On the other hand, the wafer stage ST is movable in X and Y directions by a wafer stage driving system 430 according to an instruction from the main control system 400, and the position of the reticle stage ST is accurately measured by the laser interferometer 10.

Numeral 35 in this drawing refers to a movable mirror (reflecting mirror) firmly attached to the reticle stage RS. An alignment step prior to exposure of sub-measure patterns is effected by means of an alignment microscope 20. Distortion is adjusted as a lens constituting the projection optical system PL is moved along or tilted with respect to the optical axis of the projection optical system PL as an adjustment system 420 is controlled. A specific method of adjusting the projection optical system PL is detailed in U.S. Pat. No. 5,117,255, for example.

Here, the principle of the present invention will be explained. In such an apparatus, reference wafer method is utilized for measuring and calibrating distortion of the projection optical system PL. In the reference wafer method, before an actual pattern is projected and exposed onto a product wafer, a reference wafer is used for measuring distortion of the projection lens system PL.

The reference wafer would expand or contract when temperature changes. Though there is no problem when the atmospheric temperature at the time of coordinate measurement coincides with that of the projection exposure apparatus, the magnification component of a lens cannot be measured accurately when a difference exists therebetween. In the present invention, since the residual component excluding the scaling (ratio of expansion or contraction) of the whole wafer is taken as a writing error, there is substantially no error even when the difference in temperature between the coordinate measurement system and the projection exposure apparatus remains unknown.

In general, in a coordinate measurement system (e.g., laser interferometric XY measuring system manufactured by Nikon Corp.), the position of wafer stage coordinates is measured by a length-measuring interferometer. Usually, a mark position is measured on the basis of the interferometer of the coordinate measurement system. Accordingly, when the temperature of the coordinate measurement system is high, a wafer expands, thereby the shot magnification is measured greater. Nevertheless, since the whole wafer expands in the same proportion, when the amount corresponding to the expansion or contraction of the whole wafer is subtracted from the shot magnification, the resulting value will be kept even if temperature somewhat fluctuates. In the projection exposure apparatus, when wafer scaling is measured by the wafer alignment microscope 20 upon alignment before exposure, and the shot magnification is changed correspondingly, the temperature of the wafer itself may also be at any degree.

In the conventional methods, when the wafer is mounted while being rotated with respect to the coordinate system of a coordinate measurement system, the amount corresponding to the rotation is subtracted as a matter of common knowledge. They fail to calibrate the amount corresponding to scaling, however. This calibration is effected in the present invention.

Figure 1:
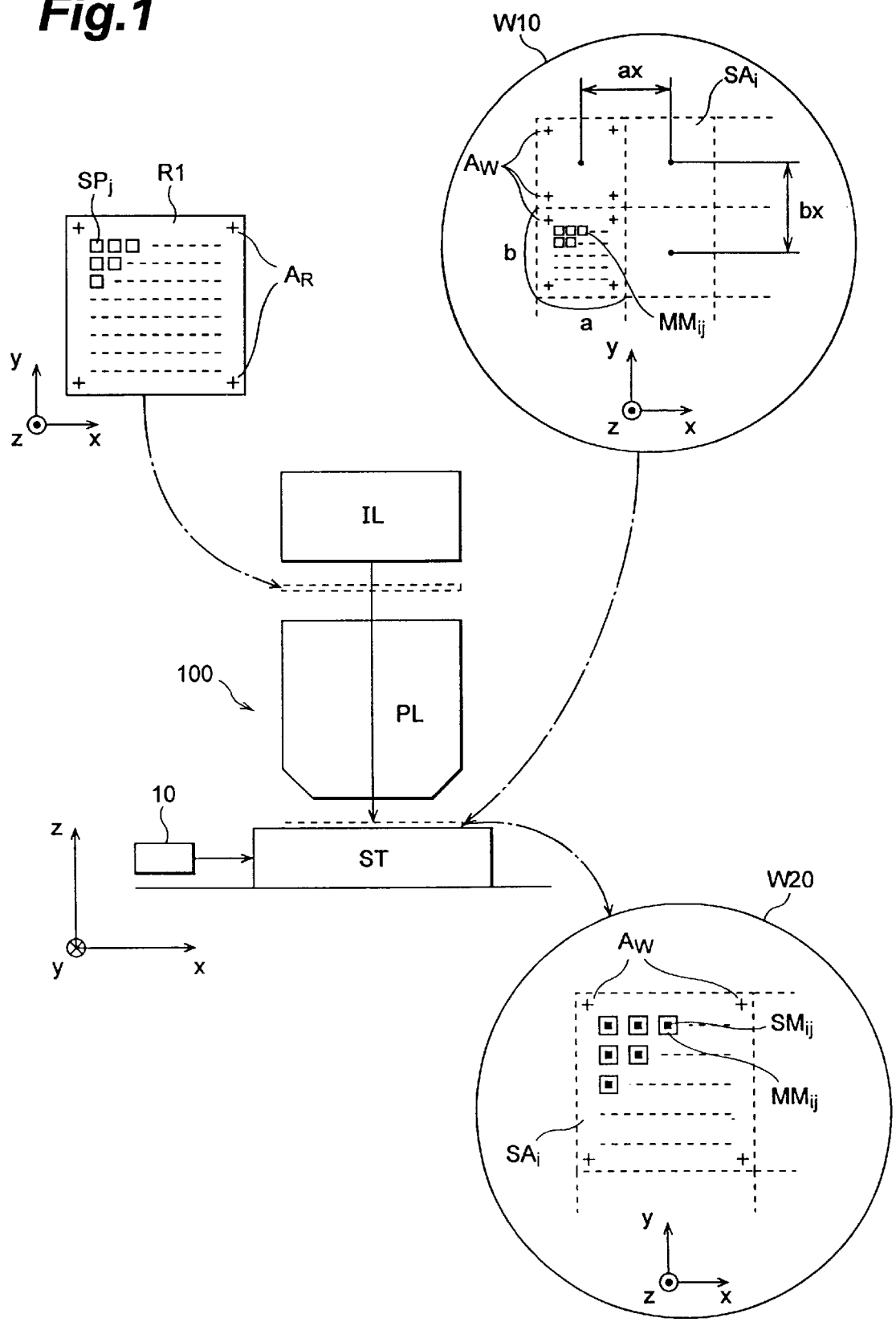
FIG. 1 is a conceptual view for explaining the measuring method according to the present invention.

In particular, in the present invention, in order to measure the distortion generated by the projection optical system as an image-forming error, as shown in FIG. 1, amounts of deviation of main measures $MM_{ij}$ (where i is the number of shot areas $SA_i$ on a reference wafer W10, and j is the number of main measures disposed within each shot area $SA_i$)

disposed on the reference wafer W10 (first reference wafer) from their respective designed positions are determined; the reference wafer W10 is disposed on the wafer stage ST of the exposure apparatus 100 to be measured, while a reference reticle R1 provided with sub-measure patterns $SP_j$ (where j is the number of sub-measure patterns disposed on the reference reticle R1) is disposed at a predetermined position, and the positions of the reference wafer W10 and reference reticle R1 are adjusted (alignment step); the exposure apparatus 100 to be measured is used for actually transferring the sub-measure patterns $SP_j$ on the reference reticle R1 onto the reference wafer W10 by way of the projection optical system PL so as to prepare a reference wafer (second reference wafer) W20 in which sub-measures $SM_j$ are superposed on the main measures $MM_{ij}$; and then the amount of relative deviation between the main measures $MM_{ij}$ and sub-measures $SM_j$ on the reference wafer W20 is measured. In this specification, the shot area $SA_i$, which may also be simply referred to as shot for convenience, indicates the area where the main measures $MM_{ij}$ are disposed on the reference wafer W10 or W20.

In particular, when measuring amounts of deviation of the main measures $MM_{ij}$, according to the amounts of positional deviations between the positions of the main measures $MM_{ij}$ on the wafer W10 measured by a predetermined coordinate measurement system 200 (see FIG. 5), which is a first environment, and the designed values of the main measures $MM_{ij}$, amounts of positional deviation of the main measures $MM_{ij}$ excluding a first fluctuation component of the reference wafer W10 which depends on this measurement environment are calculated. The first fluctuation component includes not only an expansion or contraction component of the reference wafer W10 with respect to its designed value which depends on the atmospheric temperature in the measurement environment of the reference wafer W10, but also the rotation component of the reference wafer W10 disposed on a wafer stage 230 of the measurement system 200, perpendicularity error component of the wafer stage 230, and offset amount of the measurement system 200 (parallel shift amount of the reference wafer W10).

The step of forming the sub-measure $SM_{ij}$ onto the main measures $MM_{ij}$ is a step performed in the exposure apparatus to be measured (see FIG. 8), which is a second environment different from the first environment. In this step, in conformity to so-called EGA (Enhanced Global Alignment) disclosed, for example, in U.S. Pat. No. 4,780,617, precise alignment and measurement are effected. For this purpose, the reference wafer W10 and the reference reticle R1 are respectively provided with alignment marks $A_W$, and $A_R$. The expansion or contraction of the reference wafer W10 in this second environment is detected by measurement of intervals ax and bx between the shot areas $SA_i$, or measurement of intervals between the individual alignment marks $A_W$.

Further, in the reference wafer W20 prepared by the exposure apparatus to be measured, the amount of relative deviation between the main measures $MM_{ij}$ and sub-measures $SM_j$ is measured by an overlay measurement system 300 (see FIG. 11) which is a third environment different from the first and second environments. This amount of relative positional deviation is calibrated by use of the amount of deviation excluding at least the fluctuation component of the main measures $MM_{ij}$ in the measurement system 200.

On the other hand, in order to enable more accurate calculation of the distortion component, there may also be provided such a configuration as to eliminate error components caused by the state of disposition of the reference reticle R1 in the exposure apparatus to be measured. Namely, the present invention can further comprise a step of calculating an amount of manufacturing positional deviation of the sub-measures $SM_j$, disposed on the reference wafer W20 by the exposure apparatus to be measured that is provided with the reference reticle R1, on the baisis of the amount of positional deviation caused by slackness of the reference reticle R1 between the position of the sub-measure patterns $SP_j$ in the reference reticle R1 measured in a fourth environment different from the first to third environment and the designed position of the sub-measure patterns $SP_j$. In this case, the amount of relative positional deviation is calibrated by the respective amounts of deviation of the main measures $MM_{ij}$ and sub-measures $SM_{ij}$. Accordingly, this measurement step concerning the reference reticle R1 is preferably performed at least prior to the step of determining the amount of relative deviation.

Further, distortion is eliminated when thus measured distortion component is canceled as the projection optical system PL of the measurement apparatus to be measured (exposure apparatus forming the sub-measures $SM_j$ onto the reference wafer W10) is adjusted by such means as that detailed in U.S. Pat. No. 5,117,255, for example.

In the present invention, from measurement data obtained in the respective measurement environments, fluctuation components which vary depending on the measurement environments are eliminated, thus yielding more accurate distortion components. Accordingly, in order to prevent the fluctuation component in the second environment from entering at least the subsequent second measurement step, the present invention can be configured such that the shot magnification of the projection optical system in the exposure apparatus to be measured is adjusted beforehand according to the expansion or contraction component of the reference wafer W10 measured in the alignment step in the second environment with respect to its designed value. This magnification adjustment can also be performed by such means as that detailed in the above-mentioned U.S. Pat. No. 5,117,255.

Figure 2:
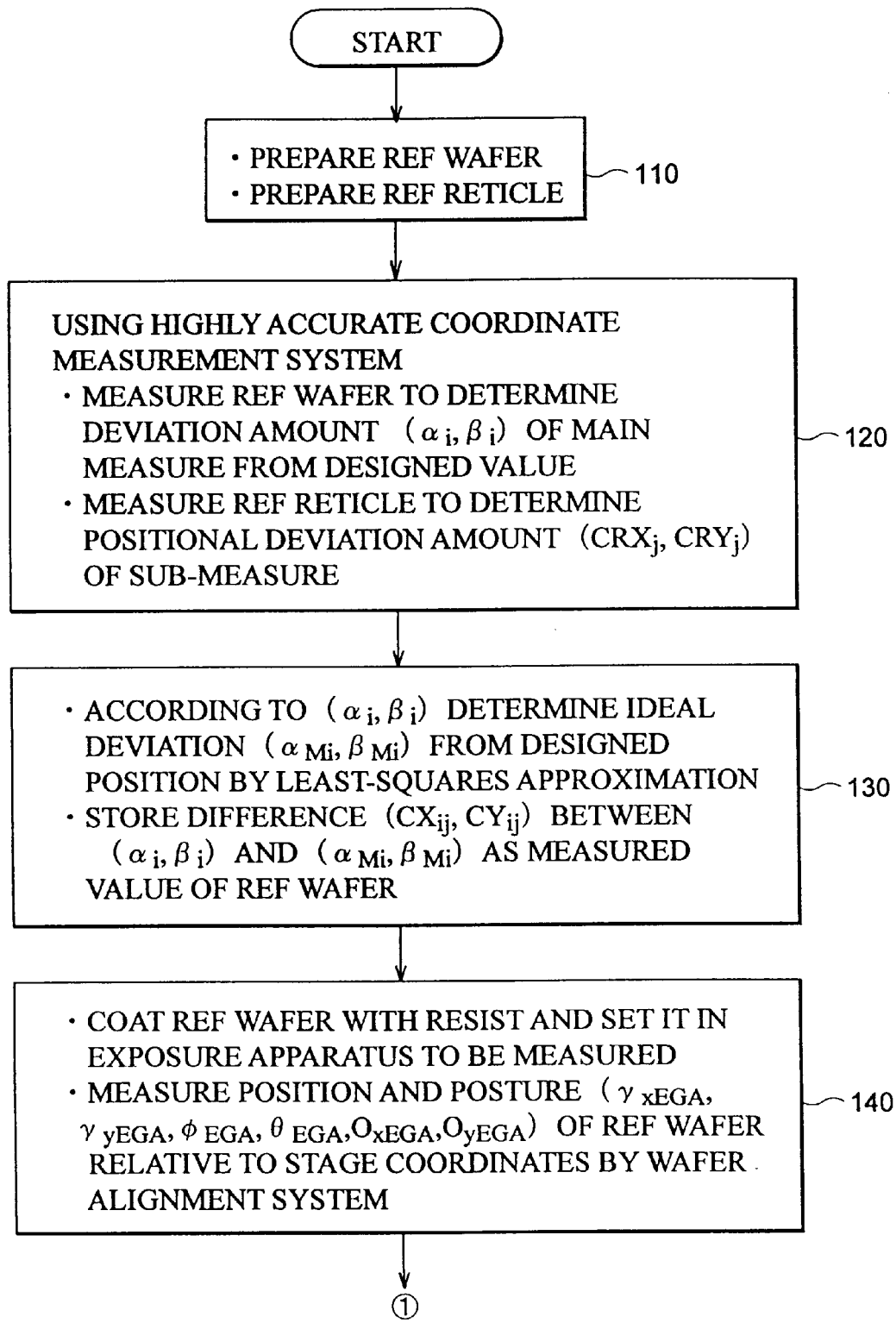
FIG. 2 is a flowchart showing steps in the first half of the method according to the first embodiment of the present invention.
Figure 3:
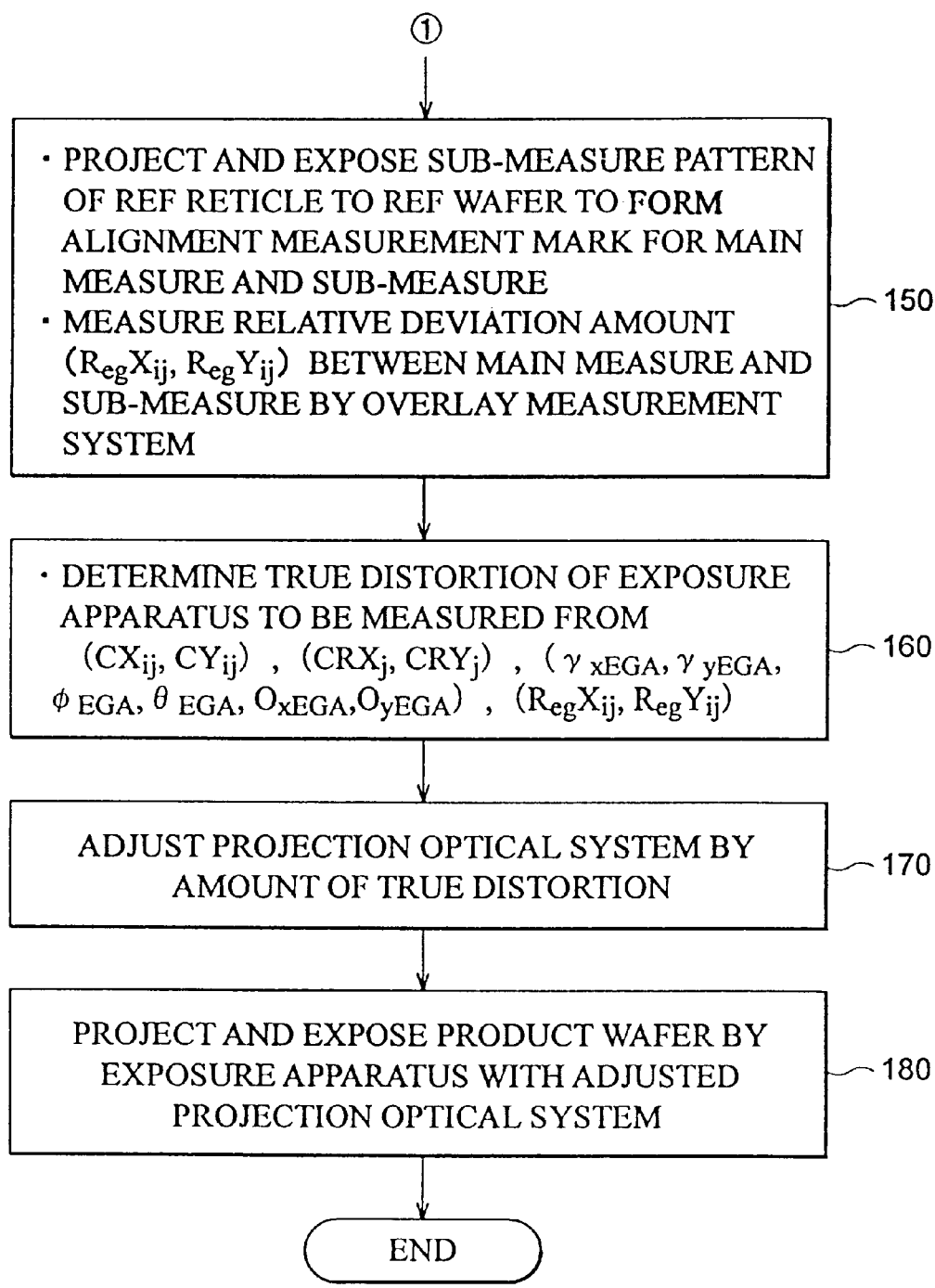
FIG. 3 is a flowchart showing steps executed subsequently to those shown in FIG. 2.

In the following, the first embodiment of the present invention will be explained with reference to the drawings. FIG. 2 is a flowchart showing, of the method of making a semiconductor device according to the present invention, steps up to measurement of the position and posture of the reference wafer W10 with respect to the stage coordinates; whereas FIG. 3 is a flowchart showing steps subsequent to those shown in FIG. 2, up to the projection and exposure of a product wafer.

In this embodiment, at first, the reference wafer W10 is prepared (FIG. 2, step 110). To this end, a wafer material to become the reference wafer W10 is initially exposed to light. This operation is the first exposure. Usable as the wafer material is the one in which a film of $SiO_2$ is uniformly formed on silicon Si, or bare Si which is silicon itself.

The projection exposure apparatus used for preparing the reference wafer W10 does not need high accuracy. Also, it does not have to reduce its lens distortion in particular. There is no severe requirement for the flatness of its wafer holder which is not depicted. It is due to the fact that, as will be explained later, the position of the main measures formed on the reference wafer W10 would be correctly measured by the coordinate measurement system in due time. In any case, the flatness of the wafer W10 is preferably as high as possible.

Figure 5:
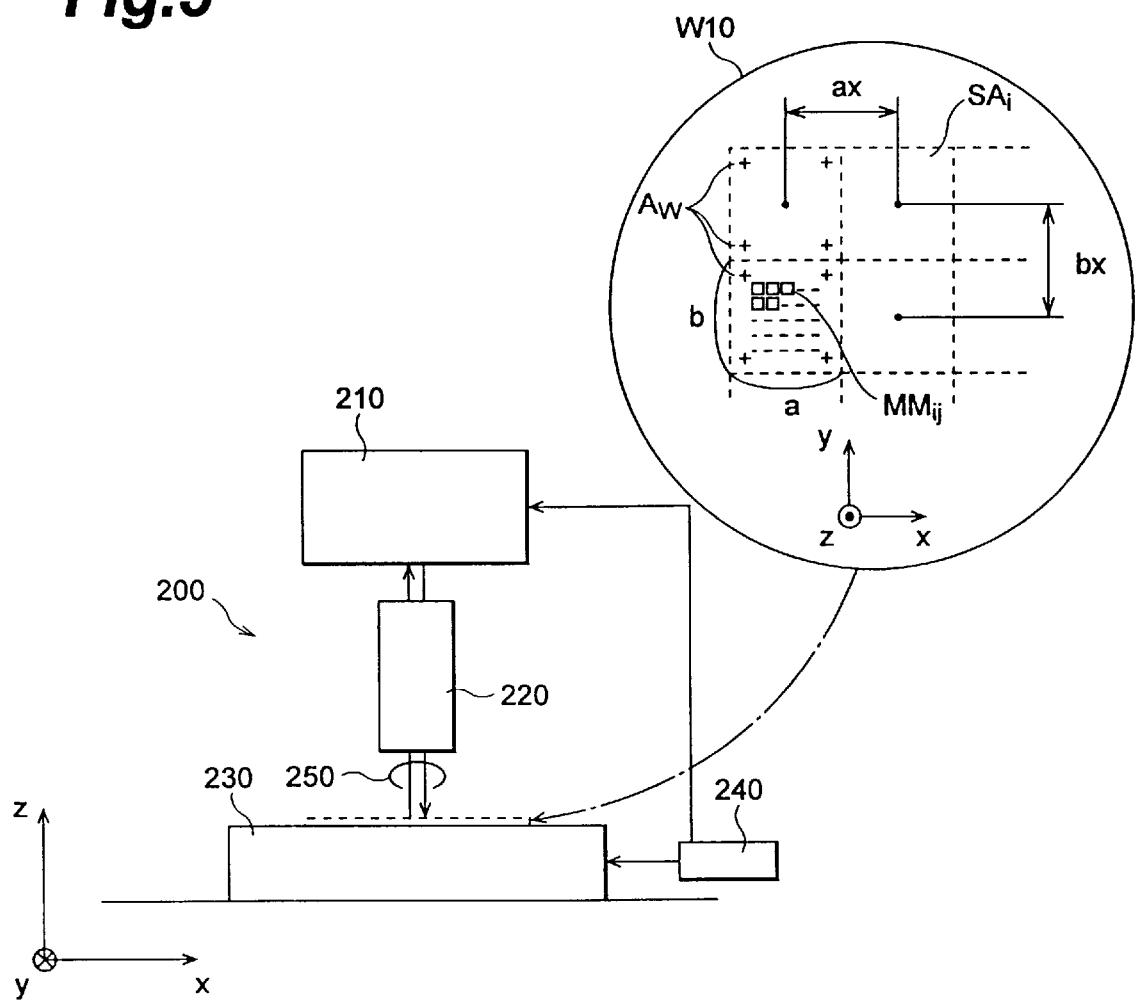
FIG. 5 is a conceptual view for explaining measurement of a main measure position on a reference wafer.

FIG. 5 is a conceptual view for explaining an operation for measuring the position of main measures $MM_{ij}$ disposed on the reference wafer W10. The individual main measures $MM_{ij}$ on the prepared reference wafer W10 are measured by a laser interferometric XY measuring system manufactured by Nikon Corp., for example. As shown in FIG. 5, such a coordinate measurement system 200 comprises, at least, a wafer stage 230 for mounting the prepared reference wafer W10 by way of a wafer holder (not depicted), a laser interferometer 240 for measuring the position of the wafer stage 230, a measurement system 210 (including a control system) for irradiating the reference wafer W10 disposed on the wafer stage 230 with probe light 250 and receiving the light reflected from the reference wafer W10, and a measurement optical system 220. Accordingly, the resulting measured value of the reference wafer W10 (position of the main measures $MM_{ij}$) is a value based on the coordinate system of the wafer stage 230. While FIG. 5 shows a laser interferometer for measuring the position of the wafer stage 230 along X axis, a laser interferometer for measuring the position of the wafer stage 230 along Y axis is also provided.

Figure 6A:
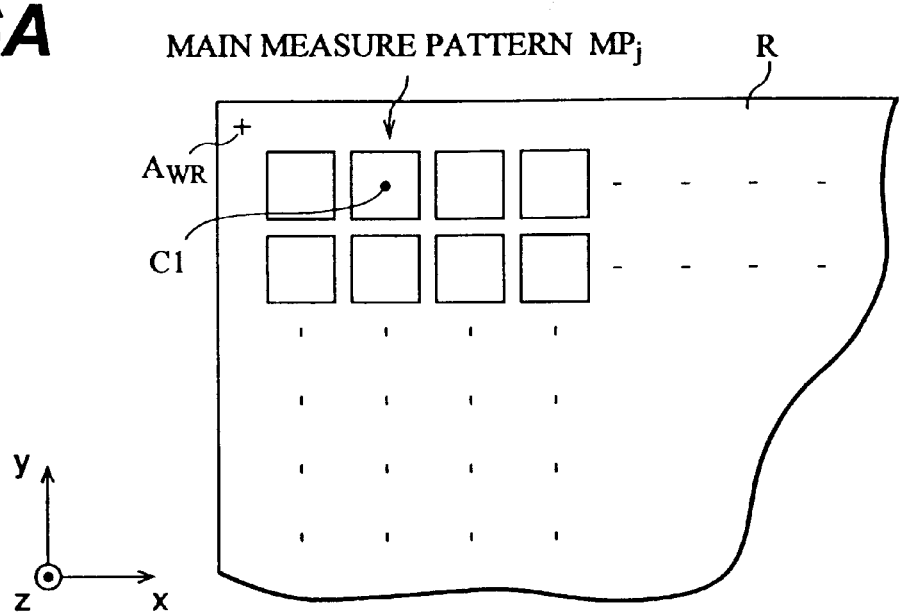
FIG. 6A is a view showing an example of main measure pattern on a reticle for forming main measures used in the present invention.
Figure 6B:
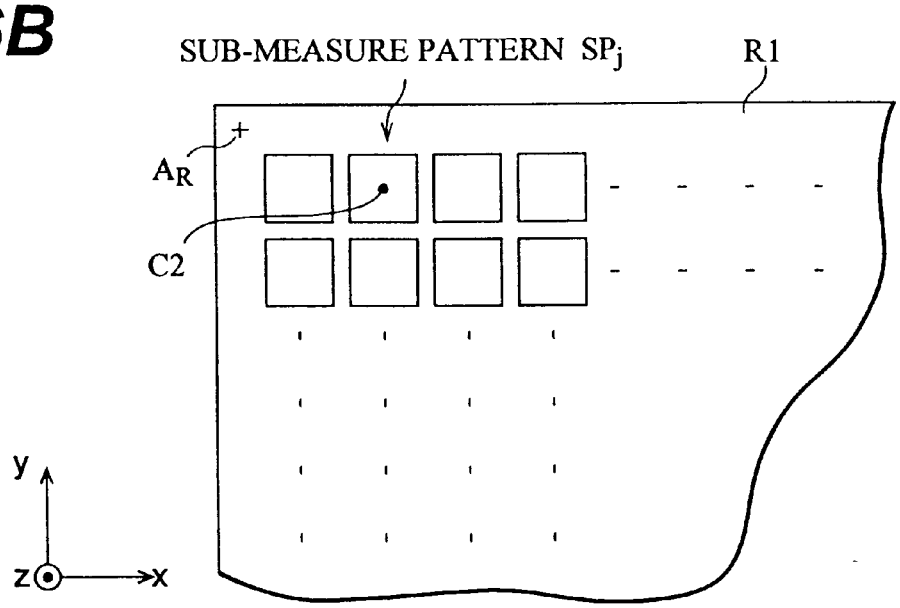
FIG. 6B is a view showing an example of sub-measure pattern on a reference reticle used in the present invention.
Figure 7B:
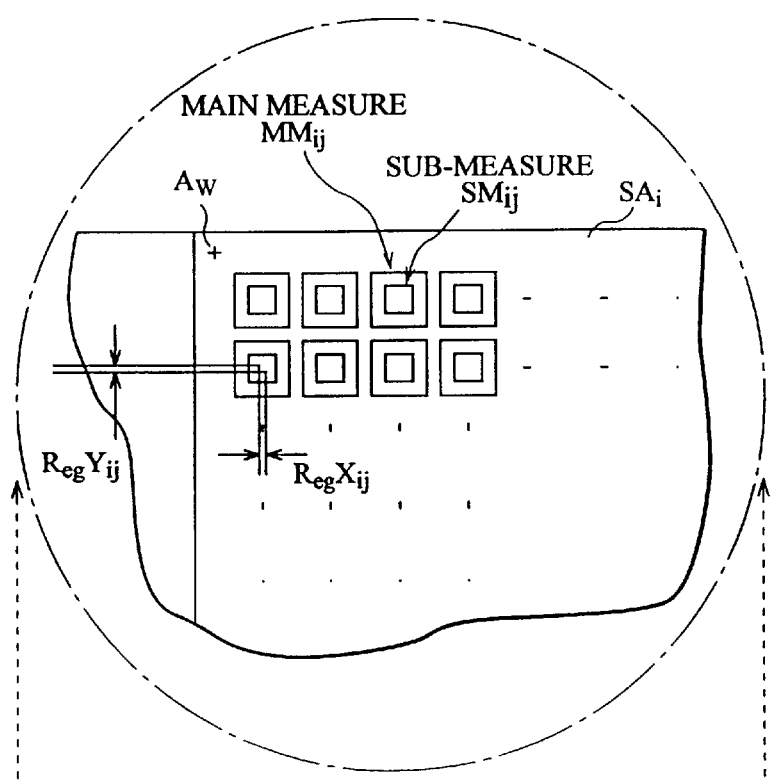
FIG. 7B is a view showing one of shots on the reference wafer shown in FIG. 7A.
Figure 7A:
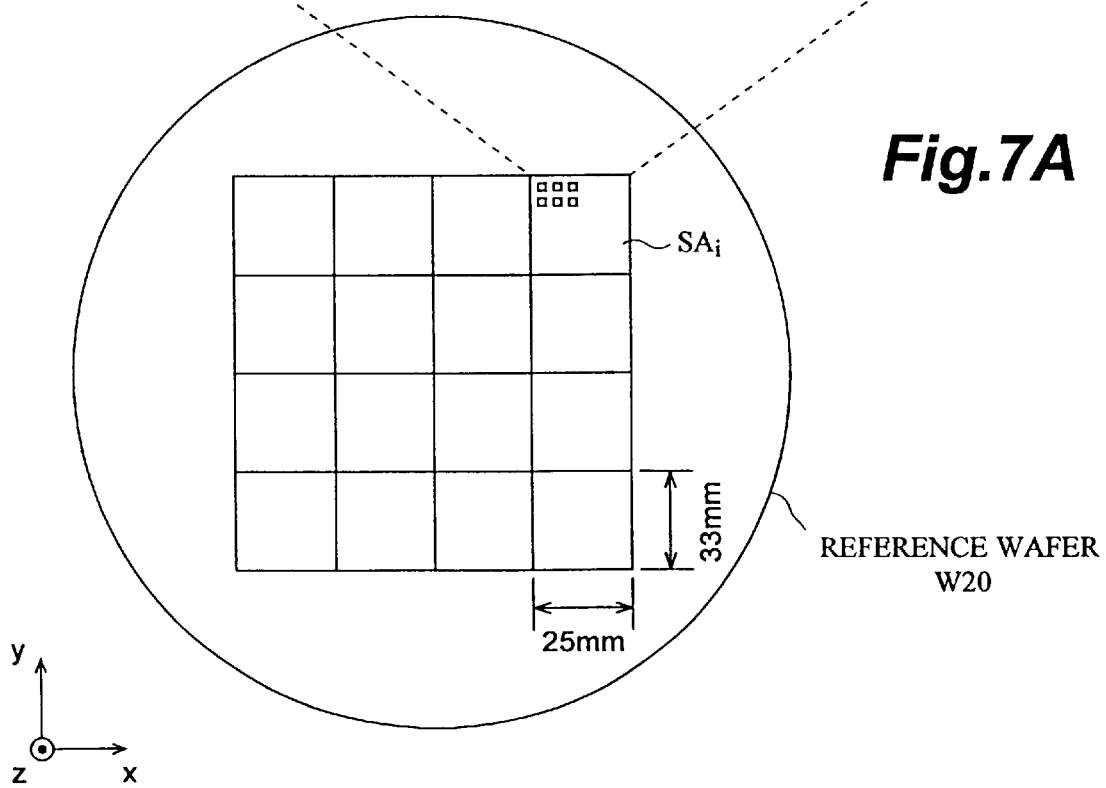
FIG. 7A is a view showing a reference wafer used in the present invention, and an example of main measure and sub-measure formed thereon in a superposing fashion.

FIG. 6A shows an example of main measure pattern on a reticle for forming main measures used in this embodiment, whereas FIG. 6B shows an example of sub-measure pattern on the reference reticle R1. FIG. 7A shows shots on the reference wafer W20, whereas FIG. 7B shows an example of main measures and sub-measures formed in one of these shots in a superposing fashion. Here, FIG. 7B is a partly enlarged view of one of the shots shown in FIG. 7A. For example, assuming the diameter of the wafer W20 to be 8 inches and the shot size to be 25 mm×33 mm, 30 or more shots can be formed on the wafer W20. Since the wafer W20 and the non-depicted wafer holder are expected to have lower degrees of flatness in their portions nearer to the outer periphery of the wafer W20, it is preferable that about 16 shots be formed in the center portion as shown in FIG. 7A.

Here, $A_{WR}$ in FIG. 6A, $A_R$ in FIG. 6B, and $A_W$ in FIG. 7B indicate alignment marks disposed on the reticle R, reference reticle R1, and reference wafer W20, respectively.

As shown in FIG. 6A, the main measure patterns $MP_j$ on the reticle R each having a square frame-like shape are arranged in a check form with intervals of 1 mm, for example, within a shot of 25 mm×33 mm. After such a pattern of the reticle R is projected and exposed by an exposure apparatus, the reference wafer W10 is accomplished by development and etching. Since the mark coordinates of each main measure will be accurately determined by the coordinate measuring system 200 later, it is unnecessary to measure beforehand the position of the patterns formed on the reticle R used upon exposure of the reference wafer W10 as mentioned above. In the drawing, C1 refers to the center coordinates of the main pattern $MP_j$, which are defined as the position of the main measure pattern $MP_{ij}$. Accordingly, the position of the main measure $M_{ij}$ formed on the reference wafer W10 is also given by the center coordinates.

Similarly, the reference reticle R1 is prepared (FIG. 2, step 110). The reference reticle R1 is prepared as being patterned by an exposure apparatus such as an electron beam exposure apparatus EB. As with the reference wafer W10, the accuracy of writing position for the electron beam exposure apparatus EB is unimportant.

Thus finished reference reticle R1 is measured by the coordinate measurement system (FIG. 2, step 120). Preferably, for eliminating perpendicularity errors in the XY moving stage of the measurement system, the reference reticle R1 is measured at 0 degree and 90 degrees, and thus measured values are averaged.

Also, while the reference reticle R1 is supported at three points with its pattern surface facing up, from the amount of flexure of the reticle R1, i.e., change in Z direction, the shape of the reference reticle R1 in the null gravitational state is determined. Then, it is determined how the reticle R1 bends and how each pattern position shifts in the state where the reticle R1 is held with the pattern surface facing down, as in the projection exposure apparatus used when manufacturing the product wafer (exposure apparatus to be measured in which distortion is measured by the method of the present invention).

A measurement system of a type in which the reference reticle R1 is held such that the pattern surface faces down and measurement is effected from thereunder, as with the projection exposure apparatus, is advantageous in that the calculation mentioned above becomes unnecessary. Here, of course, the holder is not supported at three points, and it is necessary for flatness and parallelism between individual contact surfaces to be favorable. The measured values of the reference reticle R1 are stored as ($CRX_j$, $CRY_j$) (j=1, 2, . . . , n).

Here, in the case where the magnification (shot magnification) of the projection lens PL in the exposure apparatus 100 to be measured is ¼, ⅕, or the like, ($CRX_j$, $CRY_j$) is corrected with such a shot magnification. Specifically, when the shot magnification of the projection lens PL is ¼, for example, ($CRX_j/4$, $CRY_j/4$) is stored as the amount of deviation of sub-measures.

Also, ($CRX_j$, $CRY_j$) is the deviation of the j-th sub-measure from its designed coordinates. Though the reference wafer W20 is subjected to an operation for eliminating the influence of environmental conditions, such as the temperature condition in particular, no such operation is usually effected for the reference reticle R1. It does not deny removing the influence of the temperature condition, however. This is because, while materials used for a wafer have such a high coefficient of linear coefficient that 0.1° C. is not negligible, materials used for the reticle, such as silica glass, have such a low coefficient of linear coefficient that temperature is less influential therein. Thus, it will be sufficient if the temperature at the time of measurement of ($CRX_j$, $CRY_j$) and the temperature at the time of measurement in the exposure apparatus to be measured are made substantially equal to each other or, when correction is to be effected, the temperature difference is determined and then the correction is made by calculation taking account of the coefficient of linear expansion corresponding thereto.

Next, the reference wafer W10 is measured (FIG. 2, step 120). The highly accurate coordinate measurement system 200 (see FIG. 5) is used for measuring the position of each shot of the reference wafer W10 or each point, i.e., position of the main measure. Here, the flatness of the wafer holder holding the reference wafer W10 is important, and its contact portion on the surface preferably has the same shape as that of the projection exposure apparatus 100 (see FIG. 8) used in the second exposure performed subsequently thereto.

Figure 9A:
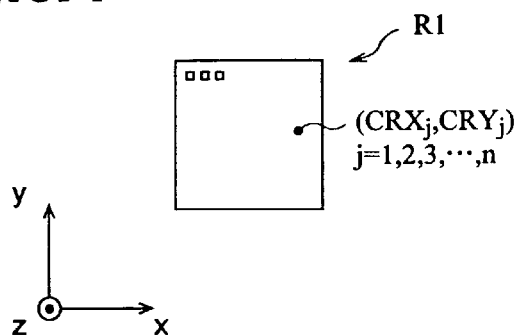
FIG. 9A is a view showing coordinates of a sub-measure pattern formed on the reference reticle.
Figure 9B:
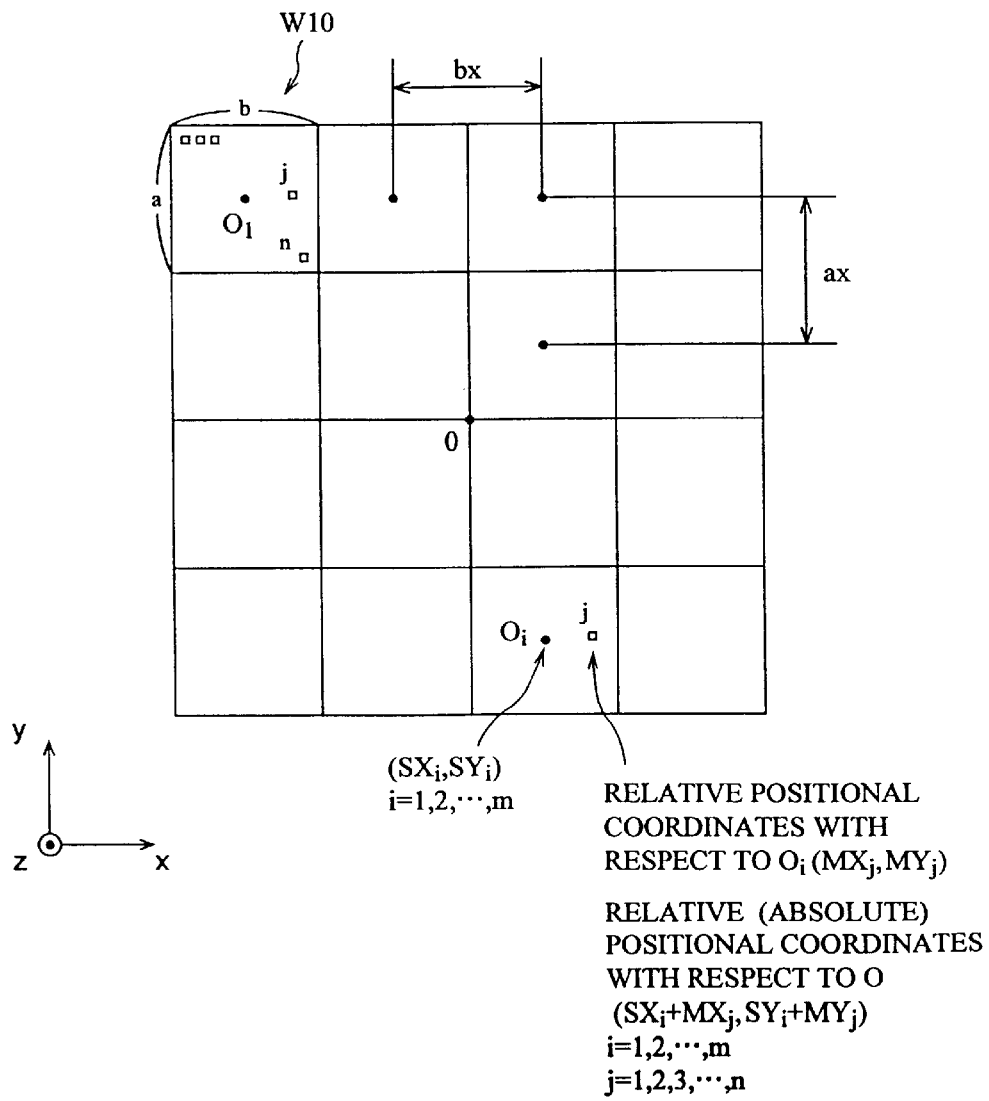
FIG. 9B is a view showing coordinates of a main measure pattern formed on the reference wafer.

Measured here is the amount of deviation of the main measure at each point from its designed value. The designed value of the formed pattern position is expressed as follows. The shot size is defined as a×b, the shot intervals as ax and bx (ax and bx being slightly greater than a and b, respectively), the shot number as m, and the coordinates of the center position in each shot as ($SX_i$, $SY_i$) wherein the wafer center is located at the origin O. Here, i is an integer from 1 to m. It is also assumed that each shot includes n pieces of measurement patterns therein, and the position of each point is defined as ($MX_j$, $MY_j$) wherein the shot center ($SX_i$, $SY_i$) is located at the origin $O_i$. Here, j is an integer from 1 to n. In this manner, the j-th mark designed position in the i-th shot is expressed as ($SX_i+MX_j$, $SY_i+MY_j$) wherein the wafer center is located at the origin O. FIGS. 9A and 9B show the foregoing relationship of coordinates. FIGS. 9A and 9B show the reference reticle R1 and the reference wafer W10, respectively. The reference wafer W10 exemplifies the case where the shot number i is 16.

When measuring the reference wafer W10, individual marks of each shot are successively positioned to the measurement system, whereby differences ($\Delta X_{ij}$, $\Delta Y_{ij}$) between the designed coordinates and actual coordinates are determined. Here, $\Delta X_{ij}$ is given by the difference between the actually measured positional coordinate $XM_{ij}$ and designed positional coordinate $XD_{ij}$ ($\Delta X_{ij}=XM_{ij}-XD_{ij}$), whereas $\Delta Y_{ij}$ is given by the difference between the actually measured positional coordinate $YM_{ij}$ and designed positional coordinate $YD_{ij}$ ($\Delta X_{ij}=YM_{ij}-YD_{ij}$). Strictly speaking, the designed positional coordinates ($XD_{ij}$, $YD_{ij}$) are ($SX_i+MX_j$, $SY_i+MY_j$) as explained with reference to FIG. 9B. For given i, the mean of j=1 to n is determined, whereby actual measured values ($\alpha_i$, $\beta_i$), which indicate an average deviation from the designed position of the i-th shot, are determined (FIG. 2, step 120).

$$\begin{pmatrix} \alpha_i \\ \beta_i \end{pmatrix} = \begin{pmatrix} \left(\sum_{j=1}^{n} \Delta X_{ij}\right)/n \\ \left(\sum_{j=1}^{n} \Delta Y_{ij}\right)/n \end{pmatrix} \quad (1)$$

Also, according to the EGA calculation detailed in U.S. Pat. No. 4,780,617, it is assumed that the designed shot position ($SX_i$, $SY_i$) and the ideal deviation ($\alpha_{Mi}$, $\beta_{Mi}$) of the shot at this position from its designed position have the relationship therebetween as follows:

$$\begin{pmatrix} \alpha_{Mi} \\ \beta_{Mi} \end{pmatrix} = \begin{pmatrix} \gamma_x - 1 & -\gamma_x \cdot \phi \\ \gamma_y \cdot \theta & \gamma_y - 1 \end{pmatrix} \begin{pmatrix} SX_i \\ SY_i \end{pmatrix} + \begin{pmatrix} O_x \\ O_y \end{pmatrix} \quad (2)$$

In the above expression, $\gamma_x$ is the wafer scaling in x direction, $\gamma_y$ is the wafer scaling in Y direction, $\phi$ is the wafer rotation about Y axis, $\theta$ is the wafer rotation about X axis, $O_x$ is the wafer shift in X direction, and $O_y$ is the wafer shift in Y direction. Though the wafer stage 230 of the coordinate measurement system 200 is movable in directions orthogonal to each other by means of an X-axis motor and a Y-axis motor, the respective feeding directions of these motors are not accurately orthogonal to each other in practice but include a slight perpendicularity error w therebetween. In expression (2), since this perpendicularity error w is included in the Y-axis wafer rotational component $\phi$, the relationship of $\phi=w+\theta$ is established between the Y-axis wafer rotational component $\phi$ and the X-axis wafer rotational component $\theta$.

For simplicity, each component in matrices is substituted by a single alphabetical character as follows:

$$\begin{pmatrix} \alpha_{Mi} \\ \beta_{Mi} \end{pmatrix} = \begin{pmatrix} A & B \\ C & D \end{pmatrix} \begin{pmatrix} SX_i \\ SY_i \end{pmatrix} + \begin{pmatrix} E \\ F \end{pmatrix} \quad (3)$$

The difference between the ideal deviation ($\alpha_{Mi}$, $\beta_{Mi}$) and the actually measured value ($\alpha_i$, $\beta_i$) may imply both of cases where the mark is actually shifted and where there is an error in measurement. Since the actually measured value ($\alpha_i$, $\beta_i$) is obtained in practice, six conversion parameters A, B, C, D, E, and F are determined by least-squares method. For each i, the difference between the ideal deviation ($\alpha_{Mi}$, $\beta_{Mi}$) and the actually measured value ($\alpha_i$, $\beta_i$) is squared, and the results are summed up for all the occurrences of i.

$$\begin{pmatrix} \varepsilon_x \\ \varepsilon_y \end{pmatrix} = \begin{pmatrix} \sum_{i=1}^{m} (\alpha_i - \alpha_{Mi})^2 \\ \sum_{i=1}^{m} (\beta_i - \beta_{Mi})^2 \end{pmatrix} \quad (4)$$

Each of ($\varepsilon_x$, $\varepsilon_y$) is differentiated with respect to A, B, C, D, E, and F, and then is set to zero, so as to yield simultaneous equations, whereby A, B, C, D, E, and F are determined (FIG. 2, step 130).

$$\begin{cases} \begin{pmatrix} A \\ B \\ E \end{pmatrix} = \begin{pmatrix} \sum_i SX_i & \sum_i SY_i & m \\ \sum_i SX_i^2 & \sum_i (SX_i \cdot SY_i) & \sum_i SX_i \\ \sum_i (SX_i \cdot SY_i) & \sum_i SY_i^2 & \sum_i SY_i \end{pmatrix}^{-1} \begin{pmatrix} \sum_i \alpha_i \\ \sum_i (\alpha_i \cdot SX_i) \\ \sum_i (\alpha_i \cdot SY_i) \end{pmatrix} \\ \begin{pmatrix} C \\ D \\ F \end{pmatrix} = \begin{pmatrix} \sum_i SX_i & \sum_i SY_i & m \\ \sum_i SX_i^2 & \sum_i (SX_i \cdot SY_i) & \sum_i SX_i \\ \sum_i (SX_i \cdot SY_i) & \sum_i SY_i^2 & \sum_i SY_i \end{pmatrix}^{-1} \begin{pmatrix} \sum_i \beta_i \\ \sum_i (\beta_i \cdot SX_i) \\ \sum_i (\beta_i \cdot SY_i) \end{pmatrix} \end{cases} \quad (5)$$

Subsequently, the measured value of the reference wafer W10 is stored. As mentioned above, the measured value ($\Delta X_{ij}$, $\Delta Y_{ij}$) obtained when the reference wafer W10 is measured by the coordinate measurement system indicates how much the actual position of each mark shifts from its designed coordinates. In the case where the same wafer is repeatedly measured, the rotational component of the wafer would vary according to the posture of the wafer mounted on the measurement system, and the scaling component of the wafer would vary depending on the environmental temperature at the time of measurement.

Notwithstanding the reproducibility of measurement accuracy of the measurement system, the result of measurement of the reference wafer W10 is preferably stored in the form kept from being influenced by other fluctuations such as wafer rotation and wafer scaling. In particular, ($CX_{ij}$, $CY_{ij}$) obtained by the following expression is stored as the measured value (FIG. 2, step 130).

$$\begin{pmatrix} CX_{ij} \\ CY_{ij} \end{pmatrix} = \begin{pmatrix} \Delta X_{ij} \\ \Delta Y_{ij} \end{pmatrix} - \begin{pmatrix} A & B \\ C & D \end{pmatrix} \begin{pmatrix} XD_{ij} \\ YD_{ij} \end{pmatrix} - \begin{pmatrix} E \\ F \end{pmatrix} \quad (6)$$

For example, as mentioned above, $A=\gamma_x-1$. $\gamma_x$ substantially equals to 1. For example, when wafer temperature rises by 1 degree, Si wafer expands by about 2.6 ppm. Assuming that the size of one shot is 20 mm×20 mm, it would yield a positional deviation as large as 52 nm in the periphery of the shot.

Figure 10:
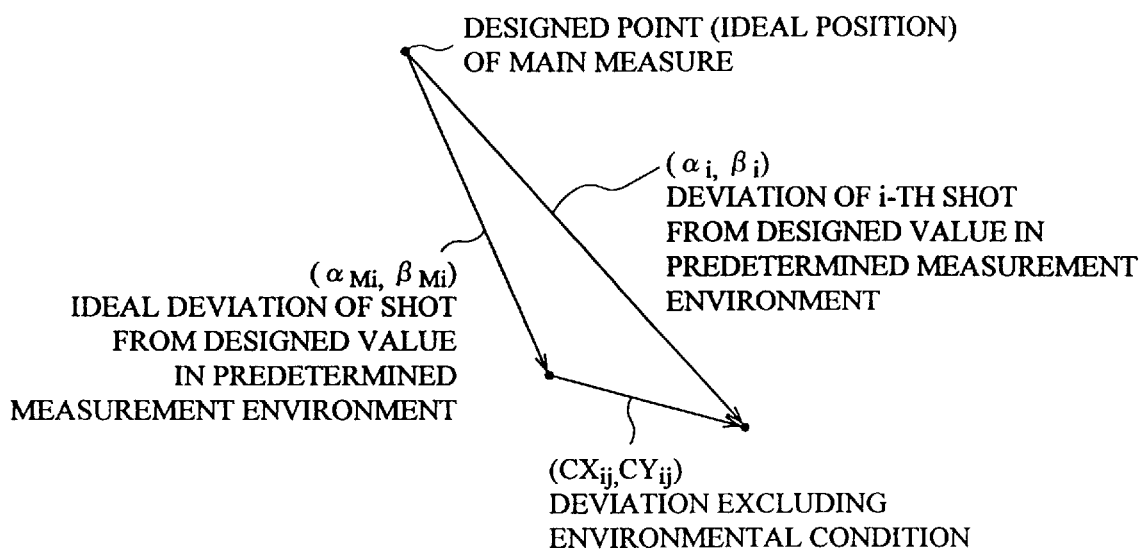
FIG. 10 is a view showing, in terms of vector, a relationship among an actually measured value of a main measure on the reference wafer, the ideal deviation from its designed position, and a stored measurement value excluding its environmental condition.

Nevertheless, since $\gamma_x$ indicating the expansion of the whole wafer also increases by 2.6 ppm at the same time, the measured value ($CX_{ij}$, $CY_{ij}$) for storage determined by the above-mentioned expression would not change between before and after the expansion. Similar effects are obtained concerning the wafer shift and wafer rotation that vary depending on the posture of the wafer mounted on the measurement system. Thus, according to expression (6), the measured value to be stored would not be influenced by the condition at the time of measurement. FIG. 10 shows the foregoing relationship in terms of vector.

As the foregoing completes preparatory operations, distortion is subsequently measured. The exposure apparatus 100 to be measured in FIG. 8 includes a non-depicted wafer holder for holding the reference wafer W10, and the flatness of this holder is important. This is because, when the wafer is bent, the pattern on the wafer surface would shift transversely by an amount given by (wafer thickness) x (inclination). For the same reason, the reticle holder for mounting the reference reticle R1 is required to have a favorable flatness.

While the reference reticle R1 is set to the projection exposure apparatus 100, the reference wafer W10 is coated with resist and is loaded in the projection exposure apparatus 100 (FIG. 2, step 140). In the projection exposure apparatus 100, the wafer alignment microscope 20 is used for measuring the alignment mark $A_W$ on the wafer W10, thereby determining the position and posture of the wafer W10 with respect to the wafer stage coordinates of the projection exposure apparatus 100. In particular, it is determined by the above-mentioned method known as EGA (FIG. 2, step 140).

Here, wafer scaling amounts $\gamma_{xYEGA}$, $\gamma_{xYEGA}$; wafer rotational amounts $\phi_{EGA}$, $\theta_{EGA}$; and wafer shift amounts $O_{xEGA}$, $O_{yEGA}$ are determined and then are fed back to the position where the reticle R1 is exposed. In this alignment step, the wafer scaling amount $\gamma_{xEGA}$ is given by the ratio of the measured shot interval $ax_M$ to the designed value of the shot interval ax ($ax_M/ax$), whereas the wafer scaling amount $\gamma_{yEGA}$ is given by the ratio of the measured shot interval $bx_M$ to the designed value of the shot interval bx ($bx_M/bx$). Alternatively, the wafer scaling amounts $Y_{xEGA}$, $\gamma_{yEGA}$ can be determined from the intervals measured between individual alignment marks $A_W$ and their designed values.

Onto the main measure formed on the reference wafer W10 upon the first exposure, the sub-measure pattern of the reference reticle R1 is exposed upon the second exposure (FIG. 3, step 150).

After the completion of exposure, the reference wafer W10 is developed, and thus finished main measure and sub-measure are measured by the overlay measurement system (registration measuring system) (FIG. 3, step 150). There are a total of m shots, each including n measurement points.

Figure 11:
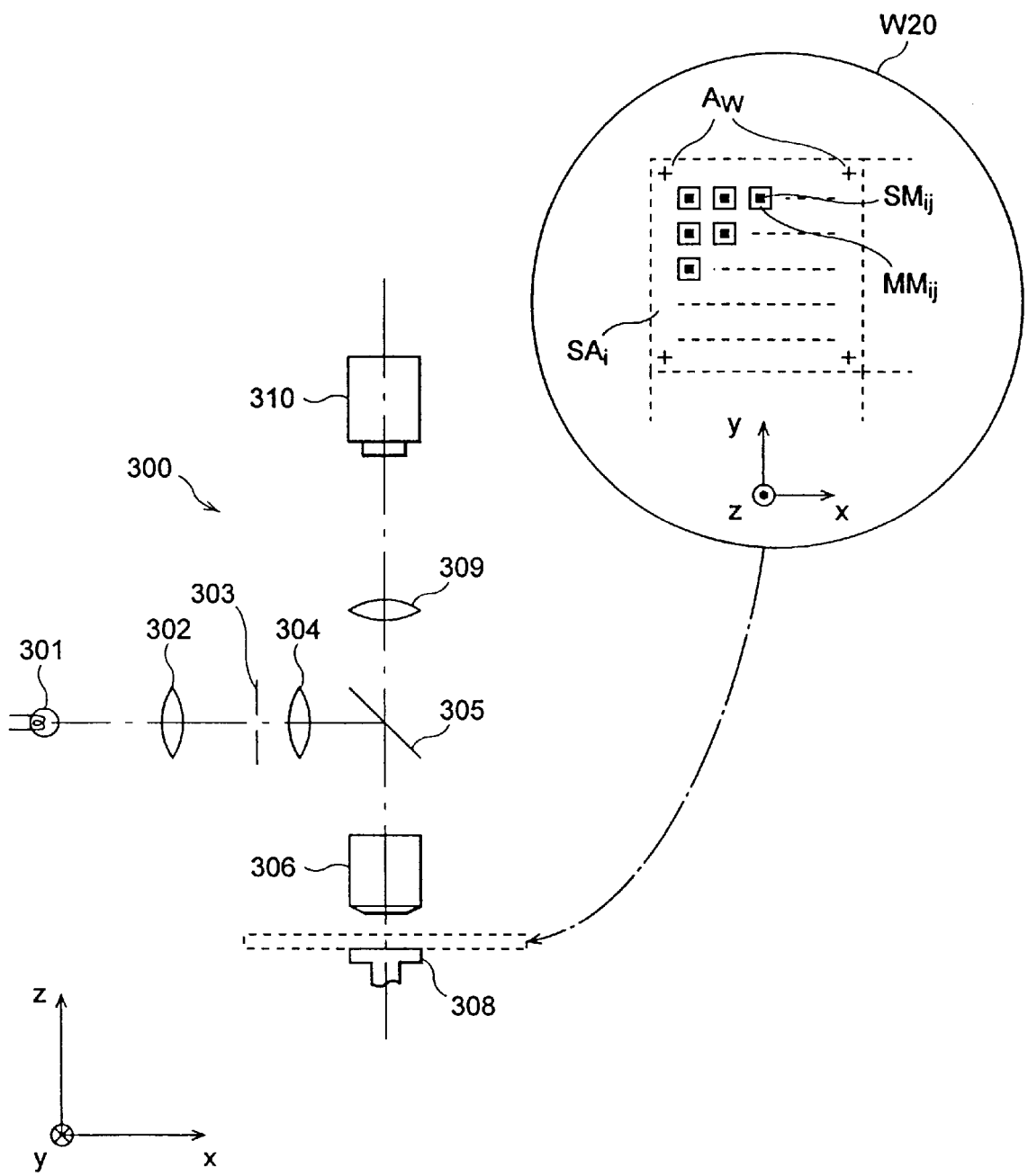
FIG. 11 is a conceptual view for explaining measurement of an amount of relative deviation.

The amount of deviation between the main measure and sub-measure can be measured by a registration measuring system manufactured by Nikon Corp., for example, the configuration of which is detailed in Japanese Patent Application Laid-open No.6-168320. FIG. 11 is a conceptual view for explaining measurement of the amount of relative deviation. The registration measuring system in this drawing comprises an illumination optical system for illuminating the reference wafer W20 held by a holder 308 with light, an objective lens 306 for converging the light reflected from the reference wafer W20, an imaging optical system 309 for forming an image of the reflected light emitted from the objective lens 306, and a CCD camera 310 for observing the image formed by the imaging optical system 309. Light from a light source 301 constituting the illumination optical system forms an image at the pupil surface of the objective lens 306 by way of a condenser lens 302, an illumination stop 303, a projection lens 304, and a half mirror 305, thereby subjecting the reference wafer W20 to Koehler's illumination.

Subsequently, the deviation amount at each point within the shot is determined so as to yield the average for the whole shot. The amount corresponding to the expansion of the wafer remains in thus obtained value. The value measured by this overlay measurement system is stored as ($RegX_{ij}$, $RegY_{ij}$) (see FIG. 7B).

Finally, calibration is performed. Namely, the residual errors such as those corresponding to wafer expansion and wafer rotation are eliminated from the measured value. In the above-mentioned EGA measurement prior to the exposure, each component such as scaling of the wafer W10 is determined. Thus determined value, which naturally forms a residual error, is allowed to be eliminated by calculation. Also, since the EGA measurement itself is expected to include an error, the residual wafer scaling error determined by the overlay measurement system is preferably corrected together therewith.

As a result, the sub-measure of the reticle R1 is projected and exposed onto the main measure of the reference wafer W10 in a superposing fashion by way of the exposure apparatus 100 to be measured, and distortion is determined according to the deviation between the main measure and sub-measure ($RegX_{ij}$, $RegY_{ij}$) determined by the overlay measurement system such as a registration measuring system manufactured by Nikon Corp., the position of main measure of the reference wafer W10 (given by ($CX_{ij}$, $CY_{ij}$)), the position of sub-measure of the reference reticle R1, and the expansion or contraction of the wafer upon exposure.

In the X component of wafer scaling, assuming the measured EGA value to be $\gamma_{xEGA}$, and the residual wafer scaling value determined from the result of measurement by the overlay measurement system according to least-squares method to be $\gamma_{xR}$, the actual wafer scaling amount upon exposure is expressed by ($\gamma_{xEGA}-\gamma_{xR}+1$). Here, the residual wafer scaling amount $\gamma_{xR}$ is obtained by parameters A1 to F1 which are determined from the measurement result ($RegX_{ij}$, $RegY_{ij}$), its average within the shot, and the like according to a procedure similar to that of the above-mentioned calculations (expression (1) to (5)).

Accordingly, assuming the measured alignment value of each mark at the i-th shot to be ($RegX_{ij}$, $RegY_{ij}$), correct distortion is determined from the relative positional coordinates ($MX_j$, $MY_j$) of the mark within the shot according to the correction calculation represented by the following expression (7):

$$CX_{ij}+(\gamma_{xEGA}-\gamma_{xR})(SX_i+MX_j) \qquad (7)$$

As a result, distortion in X direction, i.e., amount of deviation in X direction, is represented by the following expression (8):

$$R_{eg}X_{ij}+CRX_j-\{CX_{ij}+(\gamma_{xEGA}-\gamma_{xR})(SX_i+MX_j)\} \qquad (8)$$

Here, the signs "+" and "−" may change therebetween according to how coordinates are set, whereas the term $(\gamma_{xEGA}-\gamma_{xR})(SX_i+MX_j)$ varies among embodiments. $CX_{ij}$ indicates how much the j-th main measure $MM_{ij}$ in the i-th shot shifts on the basis of the coordinates within the wafer, i.e., nonlinear deviation of the main measure $MM_{ij}$ within the wafer.

The same holds true for Y direction. In practice, not only the scaling component but also the wafer rotational component, perpendicularity error of the stage, and shift component are similarly corrected.

The projection lens system of the projection exposure apparatus is adjusted by the amount corresponding to thus determined distortion (FIG. 3, step 170), and the product wafer is subjected to projection and exposure by thus adjusted projection and exposure apparatus, so as to manufacture a semiconductor device (FIG. 3, step 180).

Figure 4:
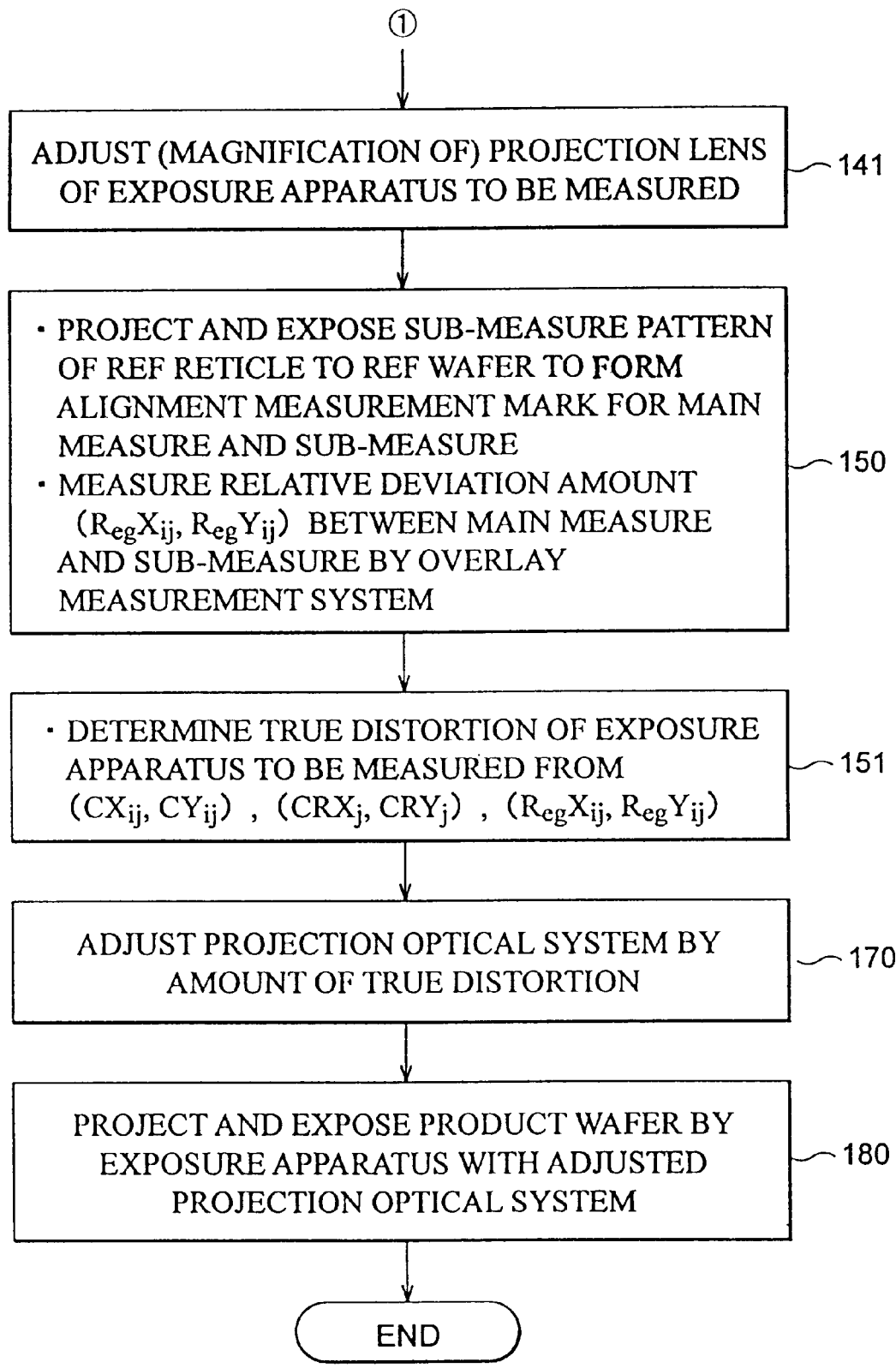
FIG. 4 is a flowchart showing steps in the first half of the method according to the second embodiment of the present invention.

In the following, the second embodiment of the present invention will be explained with reference to FIG. 4. The second embodiment differs from the first embodiment in that, when exposing the reference wafer W10 by means of the projection exposure apparatus 100 to be measured (see FIG. 8), the magnification of the projection lens system PL is controlled according to the wafer scaling value determined by EGA method, and the shot magnification is changed in response to the expansion or contraction of the wafer W10 (FIG. 4, step 141). Accordingly, when determining true distortion, correction of magnification is unnecessary (FIG. 4, step 151). Namely, the correction expression corresponding to expression (7) becomes:

$$CX_{ij}-(\gamma_{xR}-1)(SX_i+MX_j) \quad (9)$$

In the following, how to determine the above-mentioned parameters A1 to F1 will be explained. The average deviation amount ($Reg\alpha_i$, $Reg\beta_i$) of the deviation amount ($RegX_{ij}$, $RegY_{ij}$), measured by the overlay measurement system 300, at each shot area $SA_i$ is determined by the following expression (10):

$$\begin{pmatrix} Reg\alpha_i \\ Reg\beta_i \end{pmatrix} = \begin{pmatrix} \left(\sum_{j=1}^{n} RegX_{ij}\right)/n \\ \left(\sum_{j=1}^{n} RegY_{ij}\right)/n \end{pmatrix} \quad (10)$$

Then, as with the above-mentioned expression (2), the ideal deviation amount ($Reg\alpha_{Mi}$, $Reg\beta_{Mi}$) is given by the following expression (11):

$$\begin{pmatrix} Reg\alpha_{Mi} \\ Reg\beta_{Mi} \end{pmatrix} = \begin{pmatrix} \gamma_{xR}-1 & -\gamma_{xR}\cdot\phi_R \\ \gamma_{yR}\cdot\theta_R & \gamma_{yR}-1 \end{pmatrix}\begin{pmatrix} SX_i \\ SY_i \end{pmatrix} + \begin{pmatrix} O_{xR} \\ O_{yR} \end{pmatrix} \quad (11)$$

In this expression (11), $\gamma_{xR}$ is the residual scaling amount in X direction caused by the EGA measurement error upon exposure, $\gamma_{yR}$ is the residual scaling amount in Y direction caused by the EGA measurement error upon exposure, $\phi_R$ is the residual wafer rotational component about Y axis caused by the EGA measurement error upon exposure, $\theta_R$ is the residual wafer rotational component about X axis caused by the EGA measurement error upon exposure, $O_{xR}$ is the residual parallel shift amount in X direction caused by the EGA measurement error upon exposure (offset amount of the overlay measurement system 300 in X direction), and $O_{yR}$ is the residual parallel shift amount in Y direction caused by the EGA measurement error upon exposure (offset amount of the overlay measurement system 300 in Y direction)

Further, the matrix components in the above-mentioned expression (11) are respectively substituted by A1 to F1 as shown in the following expression (12):

$$\begin{pmatrix} Reg\alpha_{Mi} \\ Reg\beta_{Mi} \end{pmatrix} = \begin{pmatrix} A1 & B1 \\ C1 & D1 \end{pmatrix}\begin{pmatrix} SX_i \\ SY_i \end{pmatrix} + \begin{pmatrix} E1 \\ F1 \end{pmatrix} \quad (12)$$

Then, as shown in the following expression (13), the difference between the ideal deviation amount ($Reg\alpha_{Mi}$, $Reg\beta_{Mi}$) and the actual average deviation amount ($Reg\alpha_i$, $Reg\beta_i$) is squared for each i, and the results are summed up for all the occurrences of i.

$$\begin{pmatrix} \varepsilon_x \\ \varepsilon_y \end{pmatrix} = \begin{pmatrix} \sum_{i=1}^{m}(Reg\alpha_i - Reg\alpha_{Mi})^2 \\ \sum_{i=1}^{m}(Reg\beta_i - Reg\beta_{Mi})^2 \end{pmatrix} \quad (13)$$

Each of ($\varepsilon_x$, $\varepsilon_y$) is differentiated with respect to A1 to F1, and then is set to zero, so as to solve the simultaneous equations represented by the above-mentioned expression (5), thereby yielding the parameters A1 to F1.

Here, the X component of extraction or contraction $\gamma_{xR}$ in the reference wafer W20 can be easily determined from thus obtained parameter A1 (A1=$\gamma_{xR}$-1).

Subsequently, the value ($RegX1_{ij}$, $RegY1_{ij}$) obtained when the residual linear components caused by the EGA error, i.e., residual scaling amount, residual wafer rotational component, and residual parallel shift amount are subtracted from the actually measured deviation amount ($RegX_{ij}$, $RegY_{ij}$) between the main measure and sub-measure is determined as follows:

$$\begin{pmatrix} Reg X1_{ij} \\ Reg Y1_{ij} \end{pmatrix} = \begin{pmatrix} Reg X_{ij} \\ Reg Y_{ij} \end{pmatrix} - \begin{pmatrix} A1 & B1 \\ C1 & D1 \end{pmatrix}\begin{pmatrix} XD_{ij} \\ YD_{ij} \end{pmatrix} - \begin{pmatrix} E1 \\ F1 \end{pmatrix} \quad (14)$$

In the above-mentioned first embodiment, in order to effect exposure while preventing the wafer scaling amount from influencing the projection magnification, it is necessary for ($RegX1_{ij}$, $RegY1_{ij}$) obtained from the above-mentioned expression (14) to be corrected as represented by the following expression (15):

$$\begin{pmatrix} Reg X2_{ij} \\ Reg Y2_{ij} \end{pmatrix} = \begin{pmatrix} Reg X1_{ij} \\ Reg Y1_{ij} \end{pmatrix} - \begin{pmatrix} \gamma_{xEGA}-1 & 0 \\ 0 & \gamma_{yEGA}-1 \end{pmatrix}\begin{pmatrix} XD_{ij} \\ YD_{ij} \end{pmatrix} \quad (15)$$

As a result, in the first embodiment, the pure deviation amount between the main measure and sub-measure excluding various kinds of errors (errors in the main measure position on the reference wafer, errors in the sub-measure position on the reference reticle, and the like) at each measurement point, i.e., distortion ($DX_{ij}$, $DY_{ij}$) of the projection optical system PL, becomes the value represented by the following expression (16):

$$\begin{pmatrix} DX_{ij} \\ DY_{ij} \end{pmatrix} = \begin{pmatrix} Reg X2_{ij} \\ Reg Y2_{ij} \end{pmatrix} + \begin{pmatrix} CRX_j \\ CRY_j \end{pmatrix} - \begin{pmatrix} CX_{ij} \\ CY_{ij} \end{pmatrix} \quad (16)$$

By contrast, in the second embodiment, the distortion ($DX_{ij}$, $DY_{ij}$) of the projection optical system PL becomes the value represented by the following expression (17):

$$\begin{pmatrix} DX_{ij} \\ DY_{ij} \end{pmatrix} = \begin{pmatrix} R_{eg}XI_{ij} \\ R_{eg}YI_{ij} \end{pmatrix} + \begin{pmatrix} CRX_j \\ CRY_j \end{pmatrix} - \begin{pmatrix} CX_{ij} \\ CY_{ij} \end{pmatrix} \quad (17)$$

Here, the distortion of the projection optical system can also be determined as being averaged by the shot number m on the reference wafer as indicated by the following expression (18):

$$\begin{pmatrix} DX_j \\ DY_j \end{pmatrix} = \begin{pmatrix} \left(\sum_{i=1}^{m} DX_{ij}\right)/m \\ \left(\sum_{i=1}^{m} DY_{ij}\right)/m \end{pmatrix} \quad (18)$$

Thus measured distortion is eliminated when the projection optical system PL of the exposure apparatus 100 to be measured, shown in FIG. 8, is optically adjusted by the adjustment system 420 by an amount corresponding to the distortion determined above. A specific method of adjusting the projection optical system PL is detailed in U.S. Pat. No. 5,117,255, for example.

Also, in the present invention, as mentioned above, not only the scaling component of the reference wafer W10 but also the residual wafer rotational components φR, θR and residual parallel shift amounts $O_{xR}$, $O_{yR}$ caused by the EGA error can be eliminated at the same time.

In the method of making a semiconductor device according to the present invention, thus adjusted exposure apparatus 100 is used for projecting and exposing a predetermined pattern (circuit pattern or the like) onto the product wafer, thereby manufacturing the semiconductor device.

In addition, the second embodiment differs from the first embodiment in that, before the reference wafer W10 is exposed by the exposure apparatus 100, the projection magnification of the projection optical system PL is controlled by the adjustment system 420 according to the scaling component ($LM_x/LD_x$, $LM_y/LD_y$) of the reference wafer W10 obtained by the EGA measurement, and the shot magnification is changed in response to the expansion or contraction of the reference wafer W10.

As explained in the foregoing, according to the present invention, the amount of deviation of each main measure on a reference wafer from its designed position is determined not on the basis of the coordinate system of a coordinate measurement system but according to a relative coordinate system excluding the expansion and contraction of the whole reference wafer. Accordingly, even when the atmospheric temperature at the time of coordinate measurement and that in the exposure apparatus to be measured do not coincide with each other, distortion, which is an image-forming error, can be measured almost precisely. (There will be no problem even if the difference in temperature between the measurement by the coordinate measurement system and the exposure by the exposure apparatus to be measured remains unknown.)

Also, in the present invention, since distortion can be measured without substantial errors notwithstanding changes in measurement environment as mentioned above, it is possible to effect accurate projection and exposure.

Further, in the present invention, since the deviation between the main measure and sub-measure at each measurement point on the reference wafer is measured, measurement itself can be made faster.

What is claimed is:

1. A method of measuring, in an exposure apparatus exposing a pattern of a mask to a substrate by means of a projection optical system, an image-forming error in said projection optical system, said measuring method comprising:

a first step of detecting a position information of a first pattern provided on a reference substrate, on the basis of a position measurement result of said first pattern and a first scaling information of said reference substrate caused by a measurement environment;

a second step of setting said reference substrate having said first pattern in said exposure apparatus, and detecting a second scaling information of said reference substrate caused by an exposure environment;

a third step of exposing a second pattern onto said first pattern by means of said projection optical system; and a fourth step of detecting the image-forming error of said projection optical system, on the basis of the detected position information of said first pattern, an amount of deviation between said first and second patterns, and the detected second scaling information of said reference substrate.

2. A measuring method according to claim 1, wherein said first pattern is provided in each of a plurality of shot areas of said reference substrate,
   the second step includes detecting the second scaling information of said reference substrate, on the basis of an interval of said plurality of shot areas.

3. A measuring method according to claim 1, wherein said reference substrate is provided with alignment marks at a predetermined interval,
   the second step includes detecting the second scaling information of said reference substrate, on the basis of detection of said alignment marks provided at said predetermined interval.

4. A measuring method according to claim 1, further comprising a step of detecting a position of said second pattern in a mask provided with said second pattern.

5. A measuring method according to claim 1, further comprising a step of adjusting said projection optical system so as to reduce the image-forming error thereof, on the basis of a result of detection of said fourth step.

6. A measuring method according to claim 1, wherein the image-forming error of said projection optical system includes a two-dimensional distortion on a surface of said reference substrate.

7. A method of reducing image-forming error, the method comprising:

providing a mask stage for holding a mask;
   providing a substrate stage for holding a substrate;
   providing a projection optical system;
   measuring an image-forming error in said projection optical system by the measurement method according to claim 1; and
   adjusting said projection optical system so as to reduce the image-forming error thereof.

8. A method according to claim 7, wherein the image-forming error of said projection optical system includes a two-dimensional distortion on a surface of said reference substrate.

9. A method according to claim 1, further comprising providing the first pattern on the reference substrate.

10. A method of manufacturing a semiconductor device, said method comprising:

a first step of detecting a position information of a first pattern provided on a first substrate, on the basis of a position measurement result of said first pattern and a first scaling information of a first substrate caused by a measurement environment;

a second step of setting said first substrate having said first pattern in an exposure apparatus having a projection optical system and detecting a second scaling information of said first substrate caused by an exposure environment;

a third step of exposing a second pattern onto said first pattern by means of said projection optical system;

a fourth step of detecting an image-forming error of said projection optical system, on the basis of the detected position information of said first pattern and the detected second scaling information of said first substrate; and a fifth step of exposing a circuit pattern of said semiconductor device onto a second substrate which is set in said exposure apparatus instead of said first substrate after adjusting said projection optical system so as to reduce the image-forming error thereof.

11. A device manufactured by the method according to claim 10.

12. A method according to claim 10, wherein said first pattern is provided in each of a plurality of shot areas of said first substrate, and the second step includes detecting the second scaling information of said first substrate, on the basis of an interval of said plurality of shot areas.

13. A method according to claim 10, wherein said first pattern is provided in each of a plurality of shot areas of said first substrate, and the second step includes detecting the second scaling information of said first substrate, on the basis of detection of alignment marks provided on said first substrate at a predetermined interval.

14. A method according to claim 10, further comprising a step of detecting a position of said second pattern in a mask provided with said second pattern.

15. A method of measuring, in an exposure apparatus exposing a pattern of a mask to a substrate by means of a projection optical system, and image-forming error in said projection optical system, said measuring method comprising:

a first step of detecting a position information of a first pattern provided on a reference substrate, on the basis of a position measurement result of said first pattern and a first scaling information of said reference substrate caused by a measurement environment;

a second step of setting said reference substrate in said exposure apparatus, and detecting a second scaling information of said reference substrate caused by an exposure environment;

a third step of adjusting a projecting magnification of said projection optical system, on the basis of the detected second scaling information of said reference substrate;

a fourth step of exposing a second pattern onto said first pattern by means of said projection optical system; and a fifth step of detecting an image-forming error of said projection optical system, on the basis of the detected position information of said first pattern, and an amount of deviation between said first and second patterns.

16. A measuring method according to claim 15, wherein said first pattern is provided in each of a plurality of shot areas of said reference substrate, and the second step includes detecting the second scaling information of said reference substrate, on the basis of an interval of said plurality of shot areas.

17. A measuring method according to claim 15, wherein said first pattern is provided in each of a plurality of shot areas of said reference substrate, and the second step includes detecting the second scaling information of said reference substrate, on the basis of detection of alignment marks provided on said reference substrate at a predetermined interval.

18. A measuring method according to claim 15, further comprising a step of detecting a position of said second pattern in a mask provided with said second pattern.

19. A method of manufacturing a semiconductor device, said method comprising:

a first step of detecting a position information of a first pattern provided on a first substrate prepared, on the basis of a position measurement result of said first pattern and a first scaling information of a first substrate caused by a measurement environment;

a second step of setting said first substrate having said first pattern in an exposure apparatus having a projection optical system, and detecting a second scaling information of said first substrate caused by an exposure environment;

a third step of adjusting a projection magnification of said projection optical system, on the basis of the detected second scaling information of said first substrate;

a fourth step of exposing a second pattern onto said first pattern by means of said adjusted projection optical system; and a fifth step of detecting an image-forming error of said projection optical system, on the basis of the detected position information of said first pattern and the detected second scaling information of said first substrate; and a sixth step of exposing a circuit pattern of said semiconductor device onto a second substrate which is set in said exposure apparatus instead of said first substrate, after adjusting said projection optical system so as to reduce the image-forming error thereof.

20. A method according to claim 19, wherein said first pattern is provided in each of a plurality of shot areas of said first substrate, and the second step includes detecting the second scaling information of said first substrate, on the basis of an interval of said plurality of shot areas.

21. A method according to claim 19, wherein said first pattern is provided in each of a plurality of shot areas of said first substrate, and the second step includes detecting the second scaling information of said first substrate, on the basis of detection of alignment marks provided on said first substrate at a predetermined interval.

22. A method according to claim 19, further comprising a step of detecting a position of said second pattern in a mask provided with said second pattern.

* * * * *